(12) United States Patent
Ishida et al.

(10) Patent No.: US 10,574,094 B2
(45) Date of Patent: Feb. 25, 2020

(54) TRANSMITTER AND MICROWAVE POWER TRANSMISSION SYSTEM

(71) Applicant: KABUSHIKI KAISHA TOYOTA CHUO KENKYUSHO, Nagakute-shi, Aichi-ken (JP)

(72) Inventors: Masaya Ishida, Nagakute (JP); Toshiaki Watanabe, Nagakute (JP); Shin-ichiro Matsuzawa, Nagakute (JP)

(73) Assignee: KABUSHIKI KAISHA TOYOTA CHUO KENKYUSHO, Nagakute-shi (JP)

(*) Notice: Subject to any disclaimer, the term of this patent is extended or adjusted under 35 U.S.C. 154(b) by 219 days.

(21) Appl. No.: 15/902,155

(22) Filed: Feb. 22, 2018

(65) Prior Publication Data

US 2018/0301945 A1    Oct. 18, 2018

(30) Foreign Application Priority Data

Apr. 13, 2017    (JP) ................................ 2017-079911

(51) Int. Cl.
*H02J 7/02*    (2016.01)
*H02J 7/04*    (2006.01)
(Continued)

(52) U.S. Cl.
CPC .............. *H02J 50/20* (2016.02); *H02J 50/80* (2016.02); *H03C 1/62* (2013.01); *H04B 5/0037* (2013.01); *H04L 27/02* (2013.01)

(58) Field of Classification Search
CPC ........ H02J 50/20; H02J 50/80; H04B 5/0037; H03C 1/62; H04L 27/02
See application file for complete search history.

(56) References Cited

U.S. PATENT DOCUMENTS 8,542,091 B2    9/2013  Takei
9,287,717 B2    3/2016  Amma et al.
(Continued)

FOREIGN PATENT DOCUMENTS

JP    2003-348773 A    12/2003
JP    2008-278038 A    11/2008
(Continued)

OTHER PUBLICATIONS

Apr. 16, 2019 Office Action issued in Japanese Patent Application No. 2017-079911.

*Primary Examiner* — Alfonso Perez Borroto
*Assistant Examiner* — Esayas G Yeshaw
(74) *Attorney, Agent, or Firm* — Oliff PLC

(57) ABSTRACT

Provided is a transmitter which can maximize the efficiency of rectification in a power-receiving electronic device irrespective of the distance therebetween. The transmitter transmits electric power to the electronic device through use of a microwave. The electronic device receives the microwave, converts the microwave to DC power, and uses the DC power as operation power. The transmitter includes a carrier wave generator for generating a carrier wave; a modulating signal generator for generating a modulating signal whose level increases, decreases, or increases and then decreases during one cycle; an amplitude modulator for amplitude-modulating the carrier wave generated by the carrier wave generator by, the modulating signal output from the modulating signal generator and for amplifying the modulated carrier wave and outputting the amplified, modulated carrier wave as a transmission signal; and an antenna for radiating the transmission signal output from the amplitude modulator into a space as the microwave.

17 Claims, 4 Drawing Sheets

(51) Int. Cl.
*H02J 50/20* (2016.01)
*H04B 5/00* (2006.01)
*H04L 27/02* (2006.01)
*H02J 50/80* (2016.01)
*H03C 1/62* (2006.01)

(56) References Cited

U.S. PATENT DOCUMENTS

| | | | |
|---|---|---|---|
| 2006/0260407 A1* | 11/2006 | Donskoy | G01N 29/2412 |
| | | | 73/657 |
| 2008/0266060 A1 | 10/2008 | Takei | |
| 2012/0133216 A1 | 5/2012 | Amma et al. | |
| 2013/0147281 A1* | 6/2013 | Kamata | H02J 50/50 |
| | | | 307/104 |
| 2016/0336785 A1* | 11/2016 | Gao | H02J 50/80 |
| 2017/0070354 A1* | 3/2017 | Ragonese | H04L 12/10 |
| 2017/0093214 A1* | 3/2017 | Watanabe | H02J 50/10 |

FOREIGN PATENT DOCUMENTS

| | | |
|---|---|---|
| JP | 2011-114949 A | 6/2011 |
| JP | 2012-191796 A | 10/2012 |
| WO | 2011/065352 A1 | 6/2011 |

\* cited by examiner

TRANSMITTER AND MICROWAVE POWER TRANSMISSION SYSTEM

BACKGROUND OF THE INVENTION

Field of the Invention

The present invention relates to a transmitter for an electronic device which receives a microwave and converts it to DC power for activation of a device provided therein, and to a microwave power transmission system using the transmitter.

Description of the Related Art

There has been known a system which radiates a microwave into a space and in which the radiated microwave is received and rectified by a rectenna, and electric power produced through rectification is used as drive power. Such a system is used for exchange of information with an electronic tag including no battery such as an RF-ID tag or an IC card. Since a diode which is a nonlinear element is used for the rectenna, the input impedance varies in accordance with the input power level. Therefore, the rectification efficiency of the rectenna varies in accordance with the power level of the received microwave.

Patent Document 1 discloses a technique for solving the above-mentioned problem. This technique uses a plurality of rectennas. The level of input power is estimated on the basis of DC power produced as a result of rectification, and the configuration of connection of rectennas which provides an optimal rectification efficiency characteristic for the input power level is determined. As a result, even when the input power level changes, the maximum rectification efficiency can be realized.

Also, according to the technique disclosed in Patent Document 2, a transmitter is designed to transmit a microwave having a waveform determined such that, within a single cycle, the frequency of the microwave decreases continuously with elapse of time. A receiver includes a delay filter designed such that its delay time increases as the frequency of the received microwave increases. As a result, the pulse width is compressed, so that the input power level of the rectifying circuit is increased.

PRIOR ART DOCUMENTS

Patent Documents

Patent Document 1: Japanese Patent Application Laid-Open (kokai) No. 2011-114949
Patent Document 2: Japanese Patent Application Laid-Open (kokai) No. 2003-348773

However, the technique disclosed in Patent Document 1 requires a plurality of rectennas in the receiver and a controller for selecting the rectennas in accordance with the power level after rectification. Therefore, the apparatus becomes complex. Further, since electric power is needed for detection of the power level after rectification and for switching control for the rectennas, a problem of power loss arises. Therefore, it is difficult to use this technique or scheme for the case where power saving and quick response are required, such as the case of transmission of power to an automotive electronic key or an RF-ID tag which responds using a small power obtained through rectification within a short period of time.

The technique disclosed in Patent Document 2 uses a microwave whose frequency changes continuously. Therefore, the transmission antenna must have a characteristic which allows radiation of microwaves in a wide band, and the receiving antenna must have a characteristic which allows reception of microwaves in a wide band. However, when the transmission bandwidth of the transmission antenna and the receiving bandwidth of the receiving antenna are expanded, the radiation efficiency of the transmission antenna and the receiving efficiency of the receiving antenna decrease. Since a decrease in the radiation efficiency directly causes a decrease in the efficiency of power transmission, a wideband antenna is not suited for power transmission. Also, the received power is not controlled for obtaining the optimal rectification efficiency.

SUMMARY OF THE INVENTION

An object of the present invention is to maximize the rectification efficiency in a power-receiving electronic device without use of a wideband antenna even in the case where the relative distance between a transmitter and the power-receiving electronic device varies or is not fixed. Accordingly, the object of the present invention is to render constant the DC power produced through rectification in the electronic device irrespective of the relative distance of the electronic device with respect to the transmitter.

One aspect of the present invention which solves the above-described problem is a transmitter which transmits electric power to an electronic device through wireless transmission of a microwave, the electronic device being configured to receive the microwave, convert the microwave to DC power through use of a rectifying circuit, and use the DC power as operation power. The transmitter comprises a carrier wave generator for generating a carrier wave; a modulating signal generator for generating a modulating signal whose level increases, decreases, or increases and then decreases during one cycle; an amplitude modulator for amplitude-modulating the carrier wave generated by the carrier wave generator by the modulating signal output from the modulating signal generator and for amplifying; and an antenna for radiating the transmission signal which is amplitude-modulated and output from the amplitude modulator into a space as the microwave.

In short, in the transmitter according to the present invention, a microwave to be transmitted is amplitude-modulated such that the input power level of the rectifying circuit of the electronic device increases or decreases continuously with elapse of time within one cycle of the modulating signal. As a result, so long as the electronic device is present within a usable distance range, the rectifying circuit can realize the maximum rectification efficiency within one cycle. Notably, in the following description, the distance of the electronic device with respect to the transmitter means the relative distance of the electronic device with respect to the transmitter for the case where the electronic device moves, the case where the transmitter moves, and the case where both the electronic device and the transmitter move. It is effective to apply the present invention to an electronic device from which a battery is omitted in consideration of size reduction and convenience of use. However, the present invention does not exclude electronic devices including batteries, because the objective of the present invention is to realize the maximum rectification efficiency irrespective of the relative distance.

In the above-described transmitter of the present invention, the maximum and minimum values of amplitude of the transmission signal are desirably determined such that, when input power levels of the rectifying circuit of the electronic device which correspond to the maximum and minimum values, respectively, are defined as a maximum input power level and a minimum input power level, respectively, an optimum input power level at which the rectifying circuit has a maximum rectification efficiency falls within a range between the minimum input power level and the maximum input power level.

The minimum input power level includes the zero level. The present invention realizes this state so long as the electronic device is present in the operable (or usable) range with respect to the transmitter.

Also, the maximum value of the amplitude of the transmission signal is desirably determined such that the maximum input power level at the time when the electronic device is located at a maximum distance exceeds the optimum input power level, the maximum distance being a maximum value of a distance from the transmitter within an operable range which is determined with respect to the transmitter and within which the electronic device must operate.

If the maximum input power level of the rectifying circuit exceeds the optimum input power level when the electronic device is located at a usable maximum distance, irrespective of the position of the electronic device, there certainly exists a timing within one cycle at which the rectification efficiency becomes the maximum.

The modulating signal generator desirably generates the modulating signal which varies the amplitude of the transmission signal in accordance with a periodic function such that the amplitude of the transmission signal varies continuously and monotonously between the minimum value and the maximum value.

The modulating signal is desirably a sawtooth wave, a triangular wave, or a sinusoidal wave.

The length of one cycle of the modulating signal is desirably 0.1 sec to 2 sec.

For an electronic device approaching the transmitter from a far position, there exists an optimal distance range within which the electronic device can provide the intended function. For example, in the case where the electronic device is an electronic key which is brought into close vicinity to a car so as to unlock its doors, the electronic device must respond before coming into contact with the car. Namely, the electronic device must respond when it is located between a position corresponding to the maximum distance and a position corresponding to the minimum distance. Since it is necessary to cause the electronic device to respond within a period during which the electronic device moves from the position corresponding to the maximum distance to the position corresponding to the minimum distance, the maximum length of the one cycle is set to 2 sec.

The microwave radiated from the antenna may be a microwave whose duration is equal to or greater than the one cycle of the modulating signal and is radiated intermittently. In this case, the power consumed by the transmitter can be saved.

The electronic device may be an electronic device which has no battery and has a rectenna and which can perform a wakeup operation through use of electric power produced as a result of rectification of the microwave over a period corresponding to one cycle of the modulating signal.

The electronic device may be a device which transmits a response signal to the transmitter through use of electric power produced as a result of rectification of the microwave over a period corresponding to one cycle of the modulating signal. Namely, it is preferred that the electronic device complete the minimum operation through use of electric power produced as a result of rectification of the microwave in the period corresponding to one cycle of the modulating signal. According to the present invention, so long as the electronic device is present within the usable stance range, the maximum rectification efficiency is realized. Therefore, wake-up of the electronic device and transmission of a response signal become possible.

Another aspect of the present invention is a microwave power transmission system which comprises the transmitter of the present invention; and an electronic device whose relative distance with respect to the transmitter varies as a result of movement of the electronic device and which receives and rectifies the microwave output from the transmitter and activates a device provided therein through use of electric power produced as a result of rectification of the microwave. In this system, when the electronic device moves with respect to the transmitter (in particular, when the electronic device approaches the transmitter), the maximum rectification efficiency is realized. For example, the microwave power transmission system is an electronic key system of a car. Since the system of the present invention is a power transmission system characterized in that the maximum rectification efficiency is realized irrespective of the relative distance of the electronic device with respect to the transmitter, the electronic device may be an electronic device including a battery or a charger provided for the purpose of charging a battery.

Still another aspect of the present invention is a microwave power transmission system which comprises the transmitter of the present invention; and a plurality of electronic devices whose relative distances with respect to the transmitter differ from one another and each of which receives and rectifies the microwave output from the transmitter and activates a device provided therein through use of electric power produced as a result of rectification of the microwave.

Like the above-described case, in this microwave power transmission system as well, the electronic device may be an electronic device including a battery or a charger provided for the purpose of charging a battery.

This system includes a plurality of electronic devices whose distances from the transmitter differ from one another. The present invention encompasses the case where the transmitter moves. For example, the system is such that in the case where a plurality of sensors are present within a certain operable range, the transmitter transmits electric power to the sensors and obtains information from the sensors. In each of the plurality of sensors, the input power level of the rectifying circuit increases or decreases with elapse of time within one cycle. Accordingly, the maximum rectification efficiency is realized in each electronic device although the timing at which the maximum rectification efficiency is realized changes depending on the distance from the transmitter.

Effects of the Invention

According to the present invention, the amplitude of the microwave transmitted from the transmitter increases, decreases, or increases and then decreases during one cycle of the modulating signal. Accordingly, so long as the electronic device which receives the microwave is present within a certain maximum distance range which is set with respect to the transmitter and within which the electronic device can operate, the input power level which maximizes the rectification efficiency of the rectifying circuit of the electronic device is realized within one cycle of the modulating signal even when the distance from the transmitter changes or is not fixed. As a result, the electronic device can perform wake-up operation and transmit identification information such as the ID of the electronic device after completion of reception of the microwave over a time corresponding to one cycle of the modulating signal (the shortest time) or a time corresponding to a few cycles of the modulating signal.

DESCRIPTION OF THE PREFERRED EMBODIMENTS

Embodiments of the present invention will be described with reference to the drawings; however, the present invention is not limited to the embodiments.

First Embodiment

Figure 1:
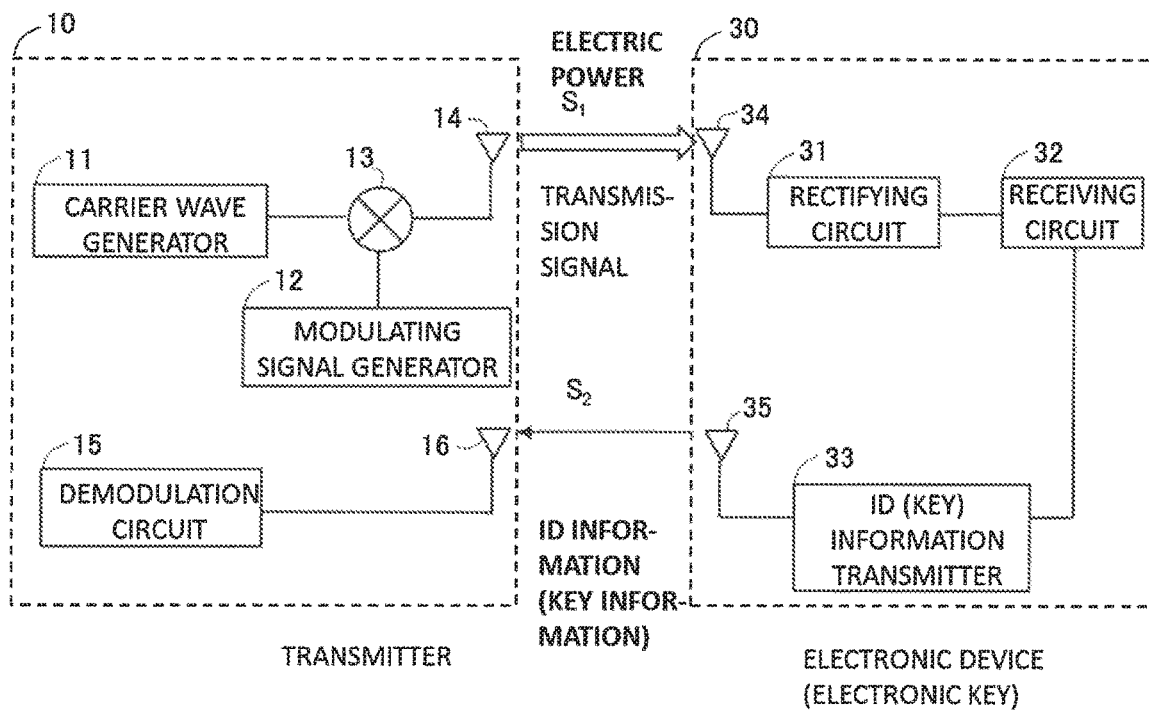
FIG. 1 is a block diagram of a power transmission system composed of a transmitter according to one embodiment of the present invention and an electronic device to which electric power is supplied from the transmitter.

FIG. 1 shows the configuration of a transmitter 10 according to a first embodiment of the present invention and the configuration of a power transmission system according to the first embodiment which is composed of the transmitter 10 and an electronic device 30 which receives a microwave from the transmitter 10. An assumed example of the power transmission system of the present embodiment is a system which is composed of a transmitter 10 mounted on a car and an electronic key 30 possessed by the owner of the car.

The transmitter 10 includes a carrier wave generator 11; a modulating signal generator 12; a mixer 13 serving as an amplitude modulator which amplitude-modulates a carrier wave of a microwave band output from the carrier wave generator 11 by a modulating signal output from the modulating signal generator 12 and amplifies the modulated carrier wave; and a transmission antenna 14 which radiates, as a transmission signal $S_1$, the amplitude-modulated microwave output from the mixer 13. Also, the transmitter 10 includes a receiving antenna 16 for receiving a response signal $S_2$ from the electronic device 30; and a demodulation circuit 15 for demodulating a signal output from the receiving antenna 16. The carrier wave generator 11 generates a carrier wave of 2.45 GHz. The frequency of the carrier wave may be a frequency in bands use of which is permitted by the Radio Act, such as 5.8 GHz, 24 GHz, etc.

Figure 2:
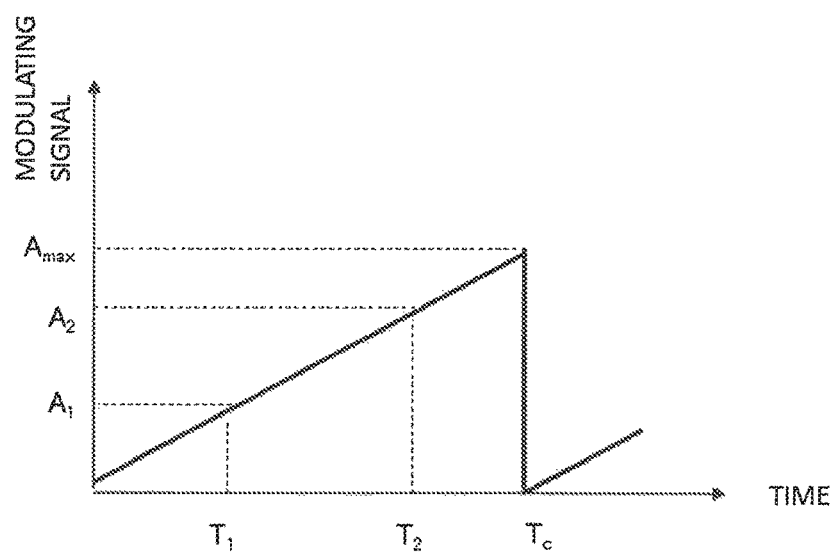
FIG. 2 is a waveform chart showing an example of a modulating signal used in the transmitter according to the embodiment.
Figure 3:
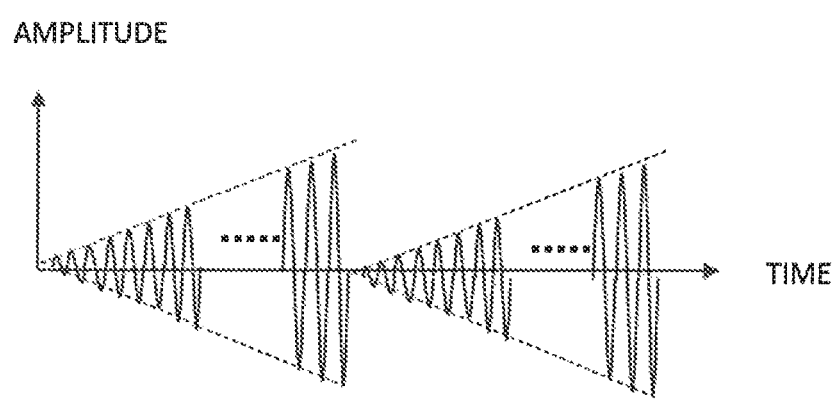
FIG. 3 is a waveform chart showing an example of a transmission signal obtained by modulating a carrier wave in the transmitter according to the embodiment.

As shown in FIG. 2, the modulating signal output from the modulating signal generator 12 is a sawtooth wave. The magnitude of the modulating signal varies in accordance with a linear function such that the magnitude increases linearly from the 0 level to the maximum level. $A_{max}$ during a period of one cycle $T_c$. The modulating signal generator 12 repeatedly and intermittently outputs, as one packet, the modulating signal of three cycles. Therefore, as shown in FIG. 3, the transmission signal output from the mixer 13 has an intermittent oscillation waveform produced as a result of amplitude modulation of the microwave of 2.45 GHz by the sawtooth wave. The time length of one cycle is 1 sec. Although the time length of the cycle depends on the required responsiveness of the electronic device 30, preferably, the time length of the cycle is 0.5 sec to 2 sec. The transmission signal $S_1$ which is amplitude-modulated, is radiated from the transmission antenna 14 into the air. Since the maximum value of the amplitude of the transmission signal $S_1$; namely, the maximum transmission power level, corresponds to the maximum level $A_{max}$ of the modulating signal, in the following description, $A_{max}$ is also used to denote the maximum transmission power level. Notably, the minimum value of the amplitude of the transmission signal; i.e., the minimum transmission power level, is not limited to the 0 level, and may be any level.

The electronic device 30 includes a receiving antenna 34; a rectifying circuit 31 for rectifying the signal received by the receiving antenna 34; a receiving circuit 32 and an ID (key) information transmitter 33 which are activated by DC power output from the rectifying circuit 31; and a transmission antenna 35. The receiving circuit 32 wakes up upon reception of the DC power output from the rectifying circuit 31 and activates the ID (key) information transmitter 33. The ID (key) information transmitter 33 code-modulates a microwave (carrier) using the ID of the owner's vehicle, and transmits the response signal $S_2$ which is code-modulated from the transmission antenna 35 toward the transmitter 10. The transmitter 10 receives the response signal $S_2$ through the receiving antenna 16 and demodulates the response signal $S_2$ by the demodulation circuit 15 to thereby decode the ID. When the decoded ID coincides with an ID registered in the vehicle, a signal indicating that the decoded ID coincides with the registered ID is output to a controller for controlling doors of the vehicle. Upon reception of that signal, the controller performs an operation; for example, unlocks the doors. Notably, the electronic device 30 includes no battery. The electronic device 30 may include a capacitor for holding the DC power produced as a result of rectification of the received transmission signal.

Figure 4:
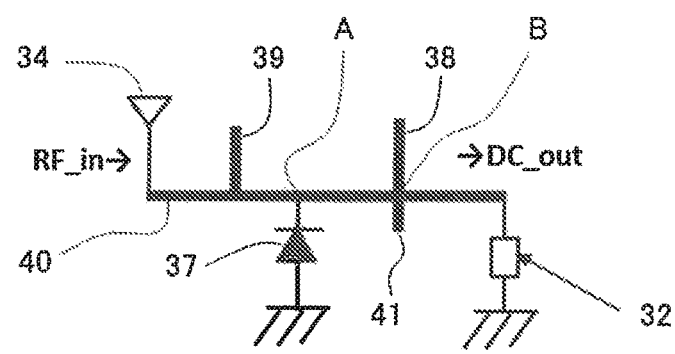
FIG. 4 is a circuit diagram of a rectifying circuit of the electronic device used in the system of the embodiment.

In the above-described power transmission system, the rectifying circuit 31 of the electronic device 30 is configured as shown in FIG. 4. FIG. 4 shows a rectenna example in which a well known single shunt rectifying circuit is used. The rectenna has a line 40 connected to the receiving antenna 34, and a Schottky barrier diode 37 whose cathode is connected to the line 40 at a point A. Also, the rectenna has a λ/4 stub 38 for the fundamental wave which is connected to the line 40 at a point B, and a λ/4 stub 41 for the second harmonic which is connected to the line 40 at the point B. Also, a stub 39 for matching for reflection prevention which is connected to the line 40 to be located between the point A and the receiving antenna 34. The line length between the point A at which the Schottky barrier diode 37 is connected to the line 40 and the point B at which the λ/4 stubs 38 and 41 are connected to the line 40 is λ/4 for the fundamental wave. This configuration equivalently realizes full-wave rectification.

Figure 5:
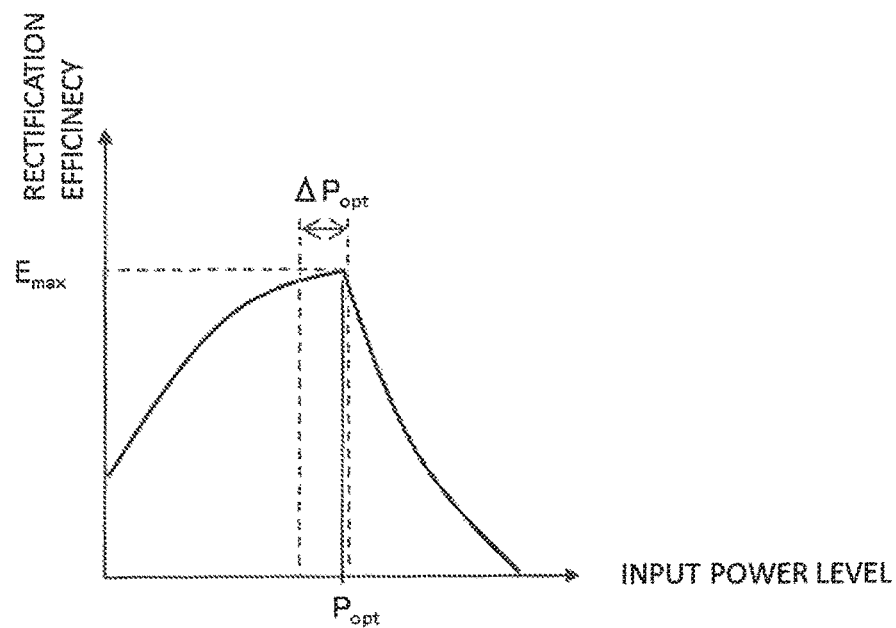
FIG. 5 is a characteristic diagram showing the relation between rectification efficiency and input power level of the rectifying circuit of the electronic device used in the system of the embodiment.

Since the rectifying circuit 31 having the above-described configuration includes the Schottky barrier diode 37, which is a non-linear element, the input impedance varies in accordance with the input power level. Accordingly, the rectifying circuit 31 has a characteristic as shown in FIG. 5; i.e., its rectification efficiency varies in accordance with the input power level of the rectifying circuit 31. Namely, there exists an optimum input power level $P_{opt}$ which provides the maximum rectification efficiency $E_{max}$. There exists an optimum input power level range $\Delta P_{opt}$ in which the maximum rectification efficiency $E_{max}$ or a rectification efficiency close to the maximum rectification efficiency is obtained.

Figure 6:
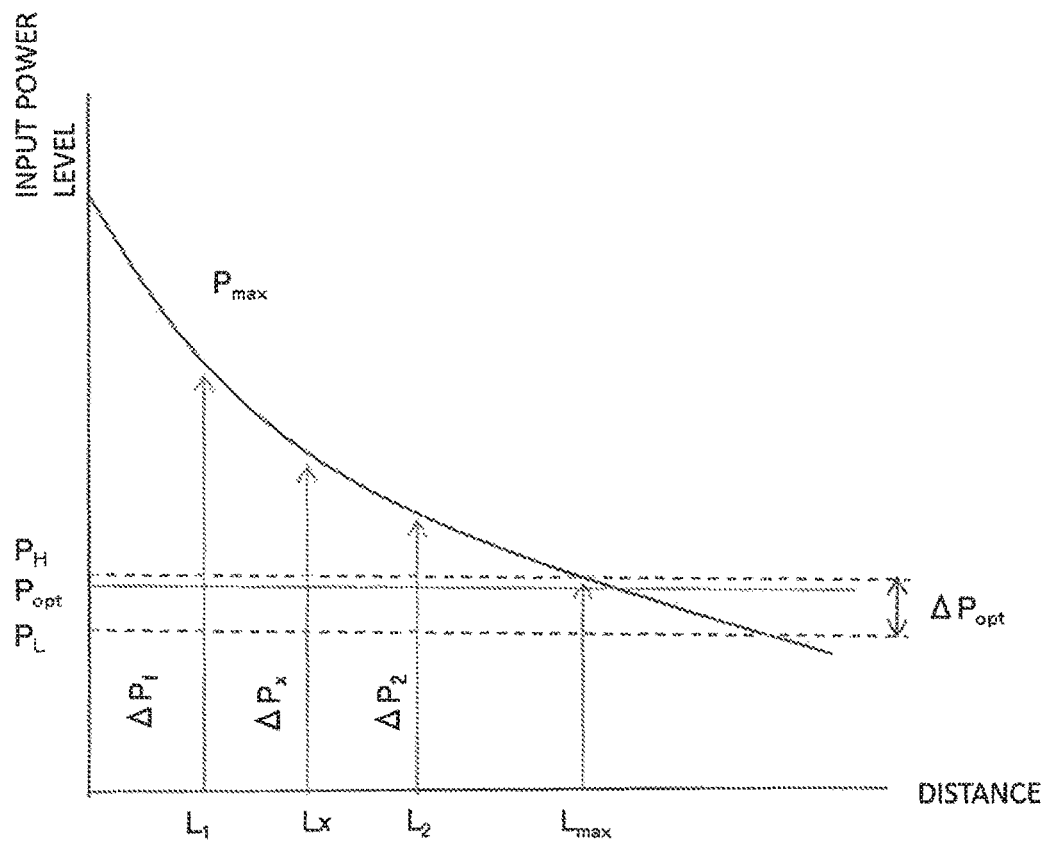
FIG. 6 is an explanatory diagram showing the operation principle of the system of the embodiment.

Under the assumption that the power level of the microwave output from the transmitter 10 is maintained at the maximum transmission power level $A_{max}$, the reception power level of the microwave received by the electronic device 30 decreases in accordance with an increase in the relative distance of the electronic device 30 with respect to the transmitter 10. FIG. 6 shows the relation between the maximum input power level $P_{max}$ of the rectifying circuit 31 and the distance of the electronic device 30 from the transmitter 10 for the case where the transmission signal is transmitted from the transmitter 30 at the maximum transmission power level $A_{max}$. The optimum input power level range $\Delta P_{opt}$ shown in FIG. 6 is the optimal range $\Delta P_{opt}$ shown in FIG. 5 and including an input power level which provides the maximum rectification efficiency.

In an assumed case where the transmission signal is not amplitude-modulated, when the electronic device 30 is located in a distance range within which the input power level of the rectifying circuit 31 does not fall within the optimum input power level range $\Delta P_{opt}$, the maximum rectification efficiency is not realized.

In view of the forgoing, in the present embodiment, the transmission power level, which is the amplitude of the transmission signal, is increased linearly from the 0 level to the maximum transmission power level $A_{max}$ during one cycle. Accordingly, the input power level of the rectifying circuit 31 also increases linearly from the 0 level to the maximum power level $P_{max}$ during one cycle. As shown in FIG. 6, when the electronic device 30 is located at the position corresponding to a distance $L_1$, $L_x$, or $L_2$, during one cycle, the input power level increases by $\Delta P_1$, $\Delta P_x$, or $\Delta P_2$ with elapse of time. The input power level certainly exceeds the optimal power level $P_{opt}$ when the input power level increases during one cycle. Accordingly, when the electronic device 30 is located at a position corresponding to any of these distances, the rectifying circuit 31 certainly has the maximum rectification efficiency $E_{max}$.

Meanwhile, in the case where the electronic device 30 is located at a position corresponding to the distance at which the maximum input power level $P_{max}$ does not exceed the upper limit level of the optimum input power level range $\Delta P_{opt}$, the input power level does not cross the entire optimum input power level range $\Delta P_{opt}$ during one cycle during which the input power level increases. Accordingly, in this case, the maximum rectification efficiency is rot realized. A distance at which the maximum input power level $P_{max}$ becomes equal to the upper limit level of the optimum input power level range $\Delta P_{opt}$ is denoted by $L_{max}$. In this case, when the distance of the electronic device 30 from the transmitter 10 exceeds the distance $L_{max}$, the maximum rectification efficiency is not realized. In other words, there exists the maximum distance $L_{max}$ at which the maximum rectification efficiency is realized. There exists a distance range within which use of the electronic device 30 is expected in the power transmission system of the present embodiment. The maximum distance $L_{max}$ must be set fall outside this distance range.

As described above, in the present embodiment, the maximum rectification efficiency can be realized even when the relative distance of the electronic device 30 with respect to the transmitter 10 changes. Accordingly, the DC power obtained in the electronic device 30 can be constantly maintained at the maximum value irrespective of the relative distance. In the case where the electronic device 30 is an electronic tag including no battery, it becomes possible to wake up the electronic tag without fail.

Second Embodiment

Figure 7:
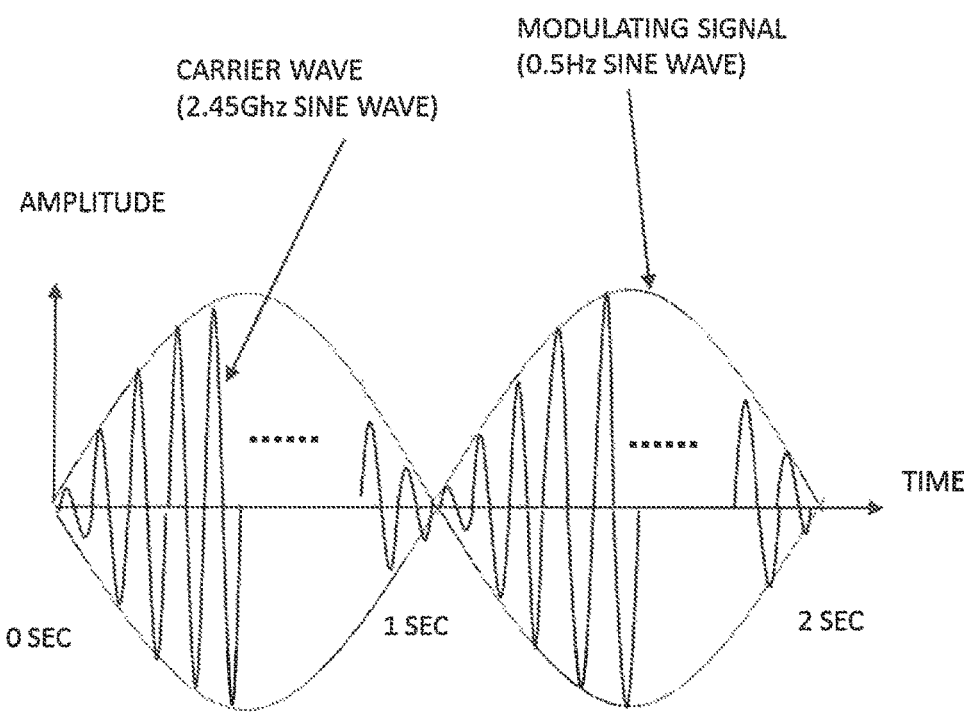
FIG. 7 is a waveform chart showing another amplitude modulation of microwave in another embodiment.
Figure 8:
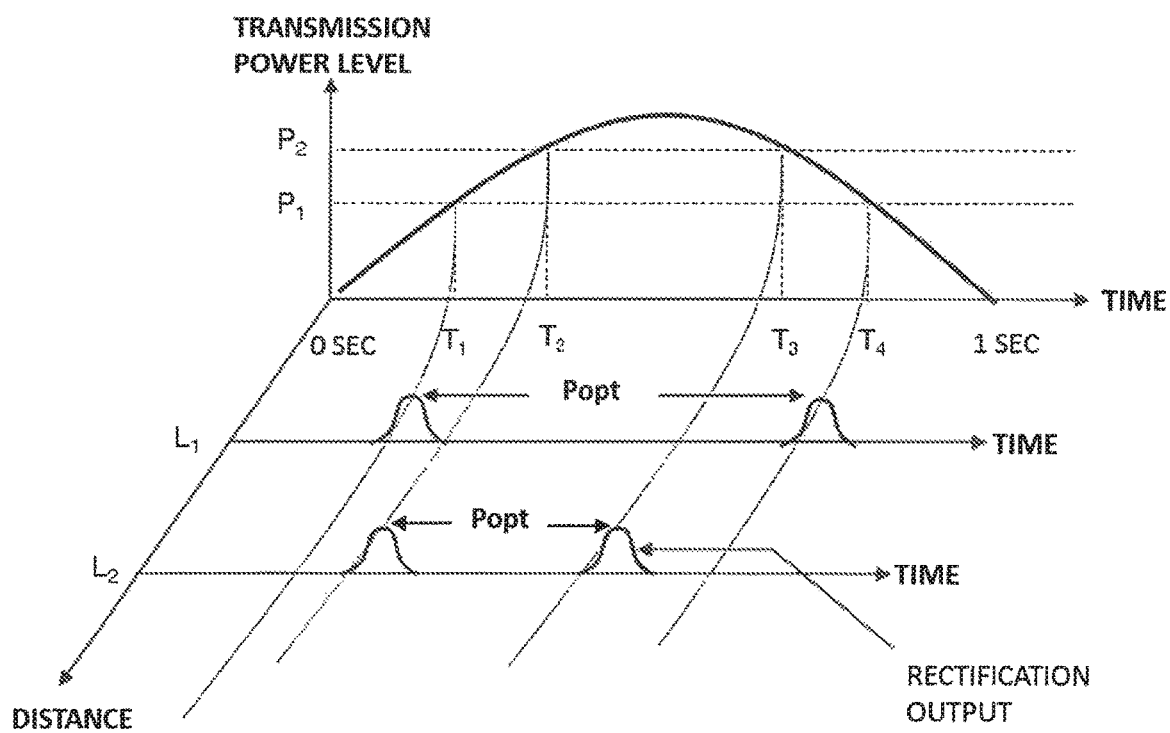
FIG. 8 is a waveform chart showing the output of the rectifying circuit in the embodiment.

FIG. 7 shows an example of another amplitude modulation of the transmission signal $S_1$. In the example, the modulating signal is a sinusoidal wave of 0.5 Hz. The half cycle of the sinusoidal wave corresponds to one cycle of the modulating signal. The transmission power level varies with time as shown in FIG. 8. The input power level of the rectifying circuit 31 becomes equal to an attenuated power level at which the transmission power level varying with the above-described sinusoidal wave is attenuated in accordance with the relative distance of the electronic device 30. As shown in FIG. 8, in the case where the electronic device 30 is located at a position corresponding to a distance $L_1$, the input power level of the rectifying circuit 31 becomes the optimum input power level $P_{opt}$ at time $T_1$ at which the transmission power level becomes a level $P_1$. Similarly, at time $T_4$, the input power level becomes the optimum input power level $P_{opt}$. Accordingly, during one cycle, the maximum rectification efficiency is realized two times. The obtained rectified power is the total of the rectified powers obtained at time $T_1$ and $T_4$, respectively.

In the case where the electronic device 30 is located at a position corresponding to a distance $L_2$ greater than the distance $L_1$, the input power level of the rectifying circuit 31 becomes the optimum input power level $P_{opt}$ at time $T_2$, later than time $T_1$, at which the transmission power level becomes a level $P_2$. Similarly, at time $T_3$ which is earlier than time $T_4$, the input power level becomes the optimum input power level $P_{opt}$. Accordingly, during one cycle, the maximum rectification efficiency is realized two times. The obtained rectified power is the total of the rectified powers obtained at time $T_2$ and $T_3$, respectively. As described above, in the present embodiment as well, the maximum rectification efficiency can be realized even when the relative distance of the electronic device 30 with respect to the transmitter 10 changes. Accordingly, the DC power obtained in the electronic device 30 can be constantly maintained at the maximum value irrespective of the relative distance. In the case where the electronic device 30 is an electronic tag including no battery, it becomes possible to wake up the electronic tag without fail.

Notably, in the above-described first and second embodiments, the transmitter 10 may be configured as follows. After the reception of the response signal $S_2$ from the electronic device 30, the transmitter 10 continuously radiates the microwave while maintaining the transmission power level at the reception timing (desirably, a timing earlier than the reception timing by a time corresponding to a propagation delay time of a circuit, etc.). The transmission power level at that timing is the power level which realizes the maximum rectification efficiency. Accordingly, after that timing, more efficient power transmission becomes possible.

The present invention can be applied to radio (wireless) power transmission for activation of RF-ID tags, IC tags, and electronic keys which have no battery.

What is claimed is:

1. A transmitter which transmits electric power to an electronic device through wireless transmission of a microwave, the electronic device being configured to receive the microwave, convert the microwave to DC power through use of a rectifying circuit, and use the DC power as operation power, the transmitter comprising:
   a carrier wave generator for generating a carrier wave;
   a modulating signal generator for generating a modulating signal whose level increases, decreases, or increases and then decreases during one cycle;
   an amplitude modulator for amplitude-modulating the carrier wave generated by the carrier wave generator by the modulating signal output from the modulating signal generator and for amplifying;
   an antenna for radiating a transmission signal which is amplitude-modulated and output from the amplitude modulator into a space as the microwave.

2. The transmitter according to claim 1, wherein maximum and minimum values of amplitude of the transmission signal are determined such that, when input power levels of the rectifying circuit of the electronic device which correspond to the maximum and minimum values, respectively, are defined as a maximum input power level and a minimum input power level, respectively, an optimum input power level at which the rectifying circuit has a maximum rectification efficiency falls within a range between the minimum input power level and the maximum input power level.

3. The transmitter according to claim 2, wherein the maximum value of the amplitude of the transmission signal is determined such that the maximum input power level at the time when the electronic device is located at a maximum distance exceeds the optimum input power level, the maximum distance being a maximum value of a distance from the transmitter within an operable range which is determined with respect to the transmitter and within which the electronic device must operate.

4. The transmitter according to claim 2, wherein the modulating signal generator generates the modulating signal which varies the amplitude of the transmission signal in accordance with a periodic function such that the amplitude of the transmission signal varies continuously and monotonously between the minimum value and the maximum value.

5. The transmitter according to claim 3, wherein the modulating signal generator generates the modulating signal which varies the amplitude of the transmission signal in accordance with a periodic function such that the amplitude of the transmission signal varies continuously and monotonously between the minimum value and the maximum value.

6. The transmitter according to claim 1, wherein the modulating signal is a sawtooth wave, a triangular wave, or a sinusoidal wave.

7. The transmitter according to claim 1, wherein the length of one cycle of the modulating signal is 0.1 sec to 2 sec.

8. The transmitter according to claim 1, wherein the microwave radiated from the antenna is a microwave whose duration is equal to or greater than the one cycle of the modulating signal and is radiated intermittently.

9. The transmitter according to claim 1, wherein the electronic device is an electronic device which has no battery and has a rectenna and which can perform a wakeup operation through use of electric power produced as a result of rectification of the microwave over a period corresponding to one cycle of the modulating signal.

10. The transmitter according to claim 2, wherein the electronic device is an electronic device which has no battery and has a rectenna and which can perform a wakeup operation through use of electric power produced as a result of rectification of the microwave over a period corresponding to one cycle of the modulating signal.

11. The transmitter according to claim 1, wherein the electronic device is a device which transmits a response signal to the transmitter through use of electric power produced as a result of rectification of the microwave over a period corresponding to one cycle of the modulating signal.

12. A microwave power transmission system comprising:
   a transmitter for transmitting electric power to an electronic device through wireless transmission of a microwave; and
   an electronic device being configured to receive the microwave, convert the microwave to DC power through use of a rectifying circuit, and use the DC power as operation power;
   wherein the transmitter comprising:
   a carrier wave generator for generating a carrier wave;
   a modulating signal generator for generating a modulating signal whose level increases, decreases, or increases and then decreases during one cycle;
   an amplitude modulator for amplitude-modulating the carrier wave generated by the carrier wave generator by the modulating signal output from the modulating signal generator and for amplifying;
   an antenna for radiating a transmission signal which is amplitude-modulated and output from the amplitude modulator into a space as the microwave; and
   wherein a relative distance of the electronic device with respect to the transmitter varies as a result of movement of the electronic device, and
   the electronic device receives and rectifies the microwave output from the transmitter and activates a device provided therein through use of electric power produced as a result of rectification of the microwave.

13. The microwave power transmission system according to claim 12, wherein maximum and minimum values of amplitude of the transmission signal are determined such that, when input power levels of the rectifying circuit of the electronic device which correspond to the maximum and minimum values, respectively, are defined as a maximum input power level and a minimum input power level, respectively, an optimum input power level at which the rectifying circuit has a maximum rectification efficiency falls within a range between the minimum input power level and the maximum input power level.

14. The microwave power transmission system according to claim 13, wherein the maximum value of the amplitude of the transmission signal is determined such that the maximum input power level at the time when the electronic device is located at a maximum distance exceeds the optimum input power level, the maximum distance being a maximum value of a distance from the transmitter within an operable range which is determined with respect to the transmitter and within which the electronic device must operate.

15. A microwave power transmission system comprising:
a transmitter for transmitting electric power to an electronic device through wireless transmission of a microwave; and
a plurality of electronic devices being configured to receive the microwave, convert the microwave to DC power through use of a rectifying circuit, and use the DC power as operation power;
wherein the transmitter comprising:
a carrier wave generator for generating a carrier wave;
a modulating signal generator for generating a modulating signal whose level increases, decreases, or increases and then decreases during one cycle;
an amplitude modulator for amplitude-modulating the carrier wave generated by the carrier wave generator by the modulating signal output from the modulating signal generator and for amplifying;
an antenna for radiating a transmission signal which is amplitude-modulated and output from the amplitude modulator into a space as the microwave; and
wherein respective relative distances of the plurality of electronic devices with respect to the transmitter differ from one another, and
each of the plurality of electronic devices receives and rectifies the microwave output from the transmitter and activates a device provided therein through use of electric power produced as a result of rectification of the microwave.

16. The microwave power transmission system according to claim 15, wherein maximum and minimum values of amplitude of the transmission signal are determined such that, when input power levels of the rectifying circuit of each of the plurality of electronic devices which correspond to the maximum and minimum values, respectively, are defined as a maximum input power level and a minimum input power level, respectively, an optimum input power level at which the rectifying circuit has a maximum rectification efficiency falls within a range between the minimum input power level and the maximum input power level.

17. The microwave power transmission system according to claim 16, wherein the maximum value of the amplitude of the transmission signal is determined such that the maximum input power level at the time when each of the plurality of electronic devices is located at a maximum distance exceeds the optimum input power level, the maximum distance being a maximum value of a distance from the transmitter within an operable range which is determined with respect to the transmitter and within which each of the plurality of electronic devices must operate.

* * * * *